(12) United States Patent
Zu et al.

(10) Patent No.: US 12,451,889 B2
(45) Date of Patent: Oct. 21, 2025

(54) MULTI-MODE FREQUENCY DIVISION CIRCUIT

(71) Applicant: Montage Electronics (Shanghai) Co., Ltd., Shanghai (CN)

(72) Inventors: Qiuyan Zu, Shanghai (CN); Gang Yan, Shanghai (CN); Yong Wang, Shanghai (CN); Pengzhan Zhang, Shanghai (CN)

(73) Assignee: Montage Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/792,540

(22) Filed: Aug. 1, 2024

(65) Prior Publication Data

US 2025/0047287 A1   Feb. 6, 2025

(30) Foreign Application Priority Data

Aug. 4, 2023 (CN) .......................... 202310982080.4

(51) Int. Cl.
*H03K 21/02* (2006.01)
*H03K 3/037* (2006.01)
*H03K 19/20* (2006.01)

(52) U.S. Cl.
CPC ............. *H03K 21/02* (2013.01); *H03K 3/037* (2013.01); *H03K 19/20* (2013.01)

(58) Field of Classification Search
CPC ........ H03K 3/037; H03K 19/20; H03K 21/02; H03K 21/026; H03K 21/08; H03K 21/10
USPC .......................................................... 327/117
See application file for complete search history.

(56) References Cited

U.S. PATENT DOCUMENTS

| | | | |
|---|---|---|---|
| 11,411,570 B1* | 8/2022 | Zhou | G06F 1/08 |
| 11,652,489 B1* | 5/2023 | Fortier | H03L 7/099 |
| | | | 327/156 |
| 11,770,116 B1* | 9/2023 | Srinivasan Gopalan | ........... |
| | | | H03K 5/05 |
| | | | 327/175 |
| 2025/0260394 A1* | 8/2025 | Tsai | H03L 7/08 |

* cited by examiner

*Primary Examiner* — William Hernandez
(74) *Attorney, Agent, or Firm* — JCIPRNET

(57) ABSTRACT

The disclosure provides a multi-mode frequency division circuit including a frequency division factor processor, a frequency divider, and a logic operator. The frequency division factor processor receives the frequency division factor, decomposes the frequency division factor to obtain a first sub-frequency division factor and a second sub-frequency division factor, and outputs the first sub-frequency division factor or the second sub-frequency division factor according to a frequency division clock signal. The divider performs frequency division on the clock signal based on the first sub-frequency division factor or the second sub-frequency division factor to generate the frequency division clock signal. The logic operator sequentially samples the frequency division clock signal according to the rising edge and falling edge of the clock signal to generate a first signal and a second signal, and the logic operator generates an output clock signal according to the first signal, the second signal, and an indication signal.

11 Claims, 5 Drawing Sheets

MULTI-MODE FREQUENCY DIVISION CIRCUIT

CROSS-REFERENCE TO RELATED APPLICATION

This application claims the priority benefit of China application serial no. 202310982080.4, filed on Aug. 4, 2023. The entirety of the above-mentioned patent application is hereby incorporated by reference herein and made a part of this specification.

BACKGROUND

Technical Field

The disclosure relates to a multi-mode frequency division circuit, and in particular to a multi-mode frequency division circuit capable of generating an output clock signal having a duty cycle of 50%.

Description of Related Art

In the related art, multi-mode frequency dividers may be mainly divided into a synchronous prescaler-counter based structure and an asynchronous cascade structure. Ordinary asynchronous cascade structures will accumulate jitter. Therefore, the related art proposes a prescaler based on divide-by-⅔ to use its first level as output, which can avoid accumulating jitter. However, neither the synchronous prescaler-counter based structure nor the asynchronous cascade structure can output a clock signal having a duty cycle of 50% at any division ratio.

SUMMARY

An objective of the disclosure is to provide a multi-mode frequency division circuit, which can generate an output clock signal having a duty cycle of 50% under any frequency division ratio.

According to an embodiment of the disclosure, a multi-mode frequency division circuit includes a frequency division factor processor, a frequency divider, and a logic operator. The frequency division factor processor receives the frequency division factor, decomposes the frequency division factor to obtain a first sub-frequency division factor and a second sub-frequency division factor, and selectively outputs the first sub-frequency division factor or the second sub-frequency division factor according to a frequency division clock signal. The frequency divider is coupled to the frequency division factor processor and performs frequency division on the clock signal based on the first sub-frequency division factor or the second sub-frequency division factor to generate the frequency division clock signal. The logic operator sequentially samples the frequency division clock signal according to the rising edge and the falling edge of the clock signal to generate a first signal and a second signal, and the logic operator generates an output clock signal according to the first signal, the second signal, and an indication signal.

DESCRIPTION OF THE EMBODIMENTS

In order to make the purpose, technical solution, and advantages of the embodiments of the disclosure clearer, the technical solution of the embodiments will be clearly and completely described below together with the drawings of the disclosed embodiments of the disclosure. Certainly, the embodiments described are only part of the embodiments of the disclosure, rather than all the embodiments. Based on the embodiments described of the disclosure, all other embodiments obtained by persons of ordinary skill in the art without creative work are within the scope of protection of the disclosure.

Figure 1:
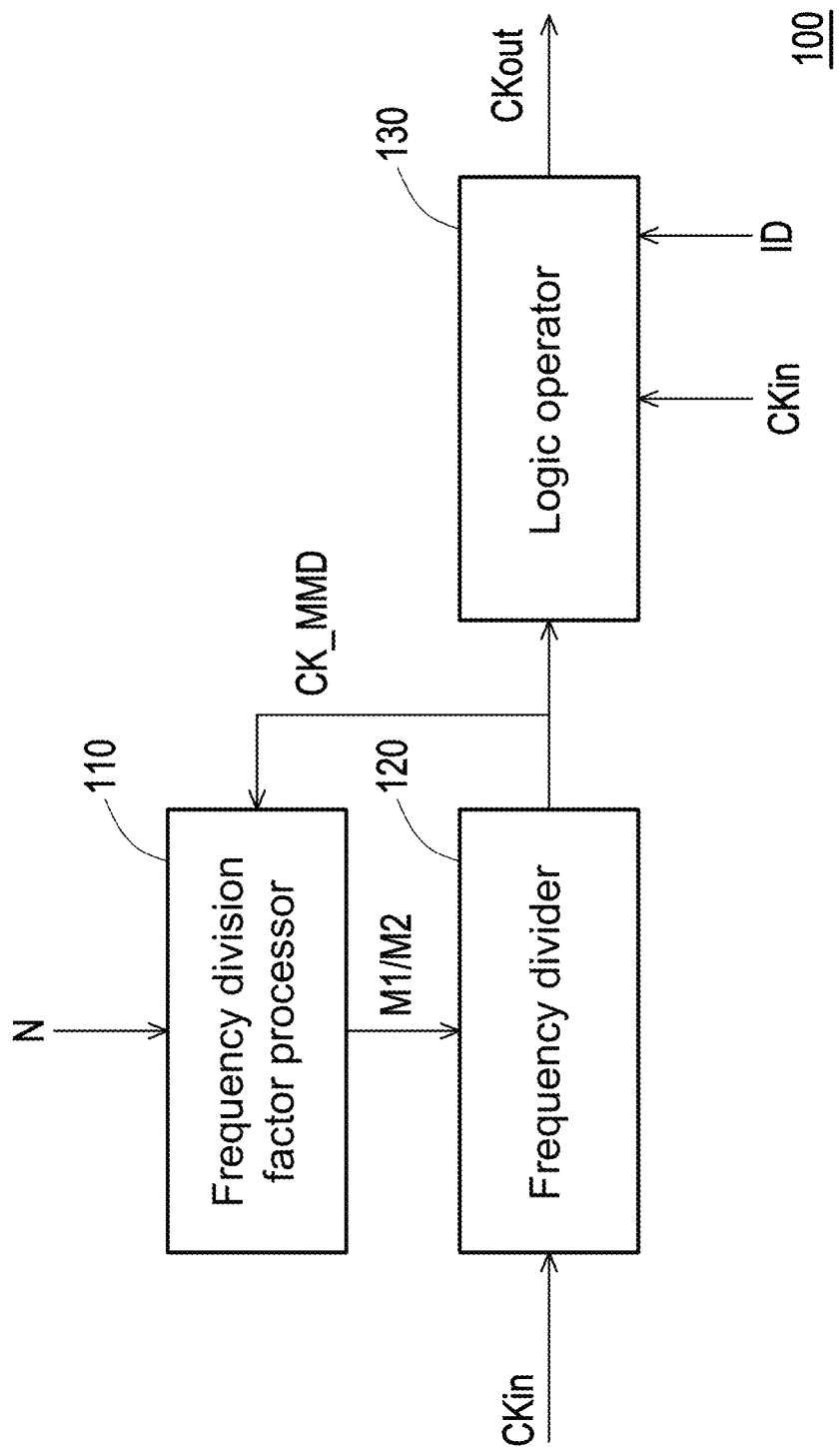
FIG. 1 shows a block diagram of a multi-mode frequency division circuit according to an embodiment of the disclosure.

Please refer to FIG. 1. FIG. 1 shows a block diagram of a multi-mode frequency division circuit according to an embodiment of the disclosure. A multi-mode frequency division circuit 100 includes a frequency division factor processor 110, a frequency divider 120, and a logic operator 130. The frequency division factor processor 110 receives a frequency division factor N, and obtains a first sub-frequency division factor M1 and a second sub-frequency division factor M2 by decomposing the frequency division factor N. The frequency division factor processor 110 selectively outputs the first sub-frequency division factor M1 or the second sub-frequency division factor M2 to the frequency divider 120 according to a frequency division clock signal CK_MMD. The frequency divider 120 is coupled to the frequency division factor processor 110. The frequency divider 120 receives a clock signal CKin, and performs frequency division on the clock signal CKin received based on the first sub-frequency division factor M1 or the second sub-frequency division factor M2 to generate the frequency division clock signal CK_MMD. The logic operator 130 is coupled to the frequency division factor processor 110 and the frequency divider 120. The logic operator 130 sequentially samples the frequency division clock signal CK_MMD according to the rising edge and the falling edge of the clock signal CKin to generate a first signal and a second signal. The logic operator 130 generates an output clock signal CKout according to the first signal, the second signal, and an indication signal ID.

Specifically, the frequency division factor processor 110 generates the first sub-frequency division factor M1 and the second sub-frequency division factor M2 by decomposing the frequency division factor N, where the sum of the first sub-frequency division factor M1 and the second sub-frequency division factor M2 is equal to the frequency division factor N. Furthermore, when the frequency division factor N is an even number, the first sub-frequency division factor M1 and the second sub-frequency division factor M2 are equal; when the frequency division factor N is an odd number, the absolute value of the difference between the second sub-frequency division factor M2 and the first sub-frequency division factor M1 is 1.

In principle, the frequency division factor processor 110 may divide the division factor N by 2 and round down to generate the first sub-frequency division factor M1. Furthermore, when the N is an even number, the second sub-frequency division factor M2 is equal to the first sub-frequency division factor M1. When the N is an odd number, the first sub-frequency division factor M1 may be increased by 1 to generate the second sub-frequency division factor M2. In an actual circuit, in order to reduce the complexity of the circuit, the frequency division factor processor 110 may discard the least significant bit (LSB) of the division factor N to obtain the first sub-frequency division factor M1. Next, the first sub-frequency division factor M1 is added to the least significant bit of the frequency division factor N to generate the second sub-frequency division factor M2.

On the other hand, the frequency division factor processor 110 selectively outputs the first sub-frequency division factor M1 or the second sub-frequency division factor M2 to the frequency divider 120 according to the logic value of the frequency division clock signal CK_MMD. In this embodiment, when the frequency division clock signal CK_MMD is a first logic value, the frequency division factor processor 110 may output the first sub-frequency division factor M1 to the frequency divider 120; on the other hand, when the frequency division clock signal CK_MMD is a second logic value, the frequency division factor processor 110 may output the second sub-frequency division factor M2 to the frequency divider 120. The first logic value may be logic 0 (or 1), and the second logic value may be logic 1 (or 0).

The frequency divider 120 may receive the clock signal CKin, and perform a frequency division operation on the clock signal CKin according to the first sub-frequency division factor M1 or the second sub-frequency division factor M2 received. When the frequency division clock signal CK_MMD generated is the first logic value, the frequency divider 120 divides the frequency of the clock signal CKin by the first sub-frequency division factor M1; also, when the frequency division clock signal CK_MMD is the second logic value, the frequency of the clock signal CKin is divided by the second sub-frequency division factor M2.

Furthermore, the frequency divider 120 obtains a frequency division signal (that is, a "flag signal FLAG" mentioned below) by sequentially dividing the frequency of the clock signal CKin by the first sub-frequency division factor M1 and by the second sub-frequency division factor M2 in turn, and triggers frequency division by two with the rising edge of the frequency division signal, thereby an N-frequency division signal is obtained, namely the frequency division clock signal CK_MMD. In this way, the ratio of high level to low level of the frequency division clock signal CK_MMD is M1/M2, and the duty cycle is close to 50%.

The logic operator 130 may receive the frequency division clock signal CK_MMD and the clock signal CKin. The logic operator 130 may sequentially sample the frequency division clock signal CK_MMD according to the rising edge and the falling edge of the clock signal CKin, and respectively generate a first signal and a second signal having a phase difference. Then, the logic operator 130 generates the output clock signal CKout according to the indication signal ID, the first signal, and the second signal, in which the duty cycle of the output clock signal CKout is 50%. In this embodiment, the indication signal ID is used to indicate whether the frequency division factor N is an odd number or an even number. Specifically, when the indication signal ID is logic 1, it is indicated that the frequency division factor N is an odd number; when the indication signal ID is logic 0, it is indicated that the frequency division factor N is an even number. In an actual circuit design, the indication signal ID may be the least significant bit of the frequency division factor N.

When the frequency division factor N is an even number, the logic operator 130 may output the output clock signal CKout equal to the first signal; on the other hand, when the frequency division factor N is an odd number, the logic operator 130 may perform an OR operation on the first signal and the second signal to generate the output clock signal CKout. In this way, no matter the frequency division factor N is an odd number or an even number, the logic operator 130 can generate the output clock signal CKout having a duty cycle of 50%.

Figure 2:
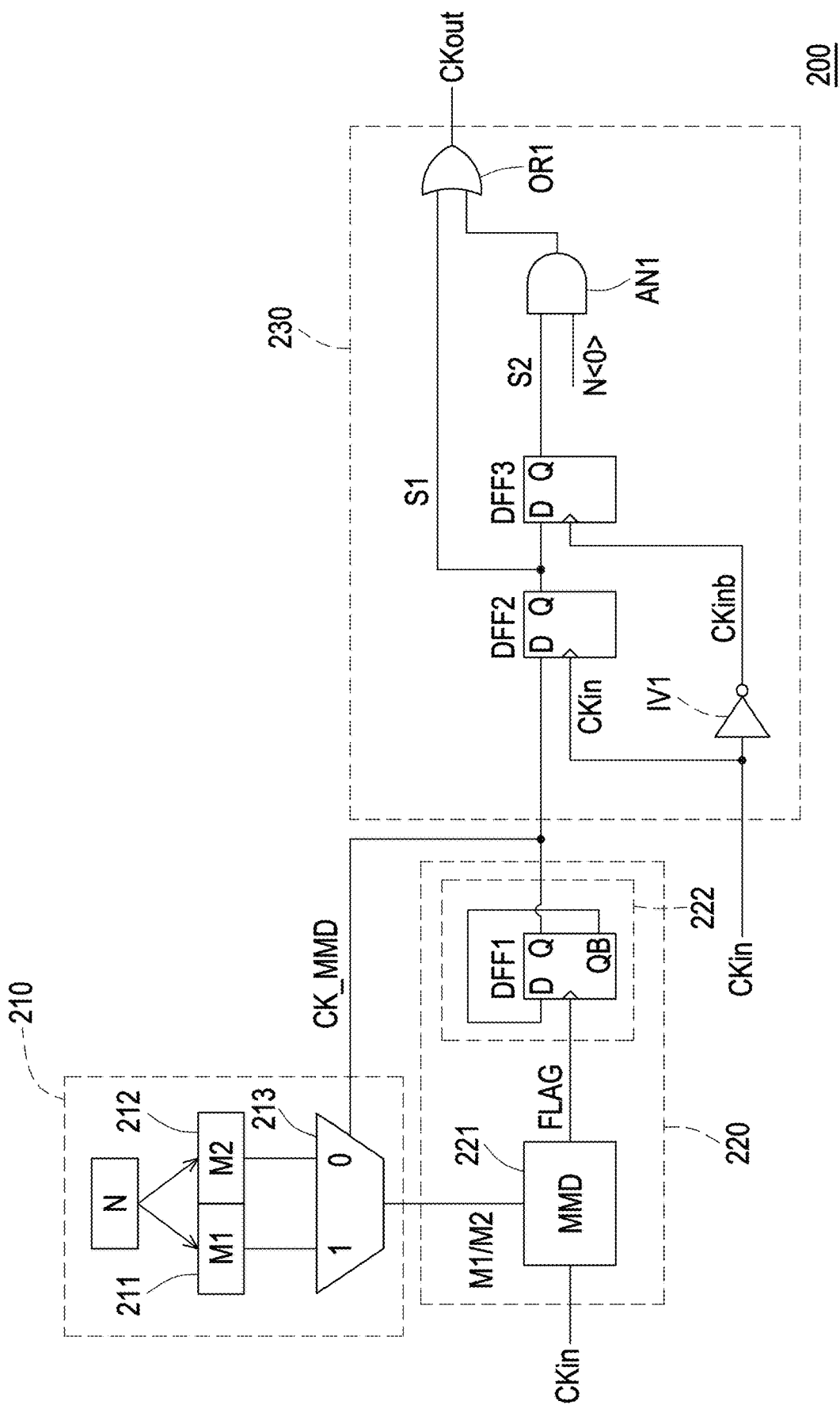
FIG. 2 shows a block diagram of a multi-mode frequency division circuit according to another embodiment of the disclosure.

Please refer to FIG. 2. FIG. 2 shows a block diagram of a multi-mode frequency division circuit according to another embodiment of the disclosure. A multi-mode frequency division circuit 200 includes a frequency division factor processor 210, a frequency divider 220, and a logic operator 230. The frequency division factor processor 210 includes buffers 211 and 212 and a multiplexer 213. The buffers 211 and 212 store the first sub-frequency division factor M1 and the second sub-frequency division factor M2 respectively, wherein the first sub-frequency division factor M1 and the second sub-frequency division factor M2 are obtained by decomposing the frequency division factor N. The decomposition method of the frequency division factor N has been described in detail in the above-mentioned embodiment, so details will not be repeated here.

The multiplexer 213 is coupled to the buffers 211 and 212, and receives the first sub-frequency division factor M1 and the second sub-frequency division factor M2 respectively stored in the buffers 211 and 212. The multiplexer 213 also receives the frequency division clock signal CK_MMD, and selectively outputs the first sub-frequency division factor M1 or the second sub-frequency division factor M2 to the frequency divider 220 according to the logic value of the frequency division clock signal CK_MMD. In this embodiment, when the frequency division clock signal CK_MMD is logic 1, the multiplexer 213 may selectively output the first sub-frequency division factor M1 to the frequency divider 220; also, when the frequency division clock signal CK_MMD is logic 0, the multiplexer 213 may selectively output the second sub-frequency division factor M2 to the frequency divider 220.

The frequency divider 220 includes a first frequency division device 221 and a second frequency division device 222 connected in series. In this embodiment, the first frequency division device 221 may be a multi-mode frequency divider MMD, and the second frequency division device 222 may be a D-type flip flop. The first frequency division device 221 receives the clock signal CKin and the first sub-frequency division factor M1 or the second sub-frequency division factor M2, and divides the frequency of the clock signal CKin by the first sub-frequency division factor M1 or the second sub-frequency division factor M2 to generate a flag signal FLAG. The first frequency division device 221 transmits the flag signal FLAG to the second frequency division device 222.

The second frequency division device 222 is used to perform frequency division by two on the flag signal FLAG to generate the frequency division clock signal CK_MMD. The second frequency division device may use the rising edge of the flag signal as a trigger signal to achieve frequency division by two. Specifically, the second frequency division device 222 may use the rising edge of the flag signal FLAG obtained by dividing the frequency of the clock signal CKin by the first sub-frequency division factor M1 and the rising edge of the flag signal FLAG obtained by dividing the frequency of the clock signal CKin by the second sub-frequency division factor M2 as trigger signals to implement frequency division by two, thereby the frequency division clock signal CK_MMD is generated. In this embodiment, the second frequency division device 222 may be implemented by a D-type flip flop DFF1. An inverting output end QB of the D-type flip flop DFF1 is coupled to a data end D thereof; a clock end of the D-type flip flop DFF1 receives the flag signal FLAG; an output end Q of the D-type flip flop DFF1 generates the frequency division clock signal CK_MMD.

Through the frequency division by two operation of the second frequency divider 222, the duty cycle of the frequency division clock signal CK_MMD may be close to 50%.

The logic operator 230 includes flip flops DFF2 and DFF3, an AND gate AN1, and an OR gate OR1. The data end D of the flip flop DFF2 receives the frequency division clock signal CK_MMD; the clock end of the flip flop DFF2 receives the clock signal CKin; the output end Q of the flip flop DFF2 generates a first signal S1. Also, the flip flop DFF3 is coupled to the rear end of the flip flop DFF2, the data end D of the flip flop DFF3 receives the first signal S1; the clock end of the flip flop DFF3 receives the inverted signal of the clock signal CKin, namely, an inverted clock signal CKinb; the output end Q of the flip flop DFF3 generates a second signal S2. In this embodiment, the inverted clock signal CKinb may be generated by an inverter IV1 performing inverting processing on the clock signal CKin.

An input end of the AND gate AN1 receives the second signal S2, another input end of the AND gate AN1 receives the least significant bit N<0> of the frequency division factor N, and an output end of the AND gate AN1 is coupled to an input end of the OR gate OR1. Another input end of the OR gate OR1 receives the first signal S1, and the output end of the OR gate OR1 may generate the output clock signal CKout.

The flip flops DFF2 and DFF3 are used to sequentially sample the frequency division clock signal CK_MMD. In an embodiment, the flip flops DFF2 and DFF3 perform sampling respectively according to the clock signal CKin and the inverted clock signal CKinb in opposite phases to each other, wherein the flip flop DFF2 may sample the frequency division clock signal CK_MMD according to the rising edge of the clock signal CKin to obtain the first signal S1, and the Flip flop DFF3 may continue to sample the first signal S1 according to the rising edge of the inverted clock signal CKinb (which may also be considered as the falling edge of the clock signal CKin) to obtain the second signal S2. On the other hand, when the least significant bit N<0> of the frequency division factor N is logic 0, it is indicated that the frequency division factor N is an even number. At this time, the AND gate AN1 outputs logic 0, and the OR gate OR1 may directly output the first signal S1 as the output clock signal CKout. On the other hand, when the least significant bit N<0> of the frequency division factor N is logic 1, it is indicated that the frequency division factor N is an odd number. At this time, the AND gate AN1 outputs the second signal S2, and the OR gate OR1 may perform an OR operation on the first signal S1 and the second signal S2 to generate the output clock signal CKout. In this way, the output clock signal CKout may have a duty cycle of 50%.

Figure 3:
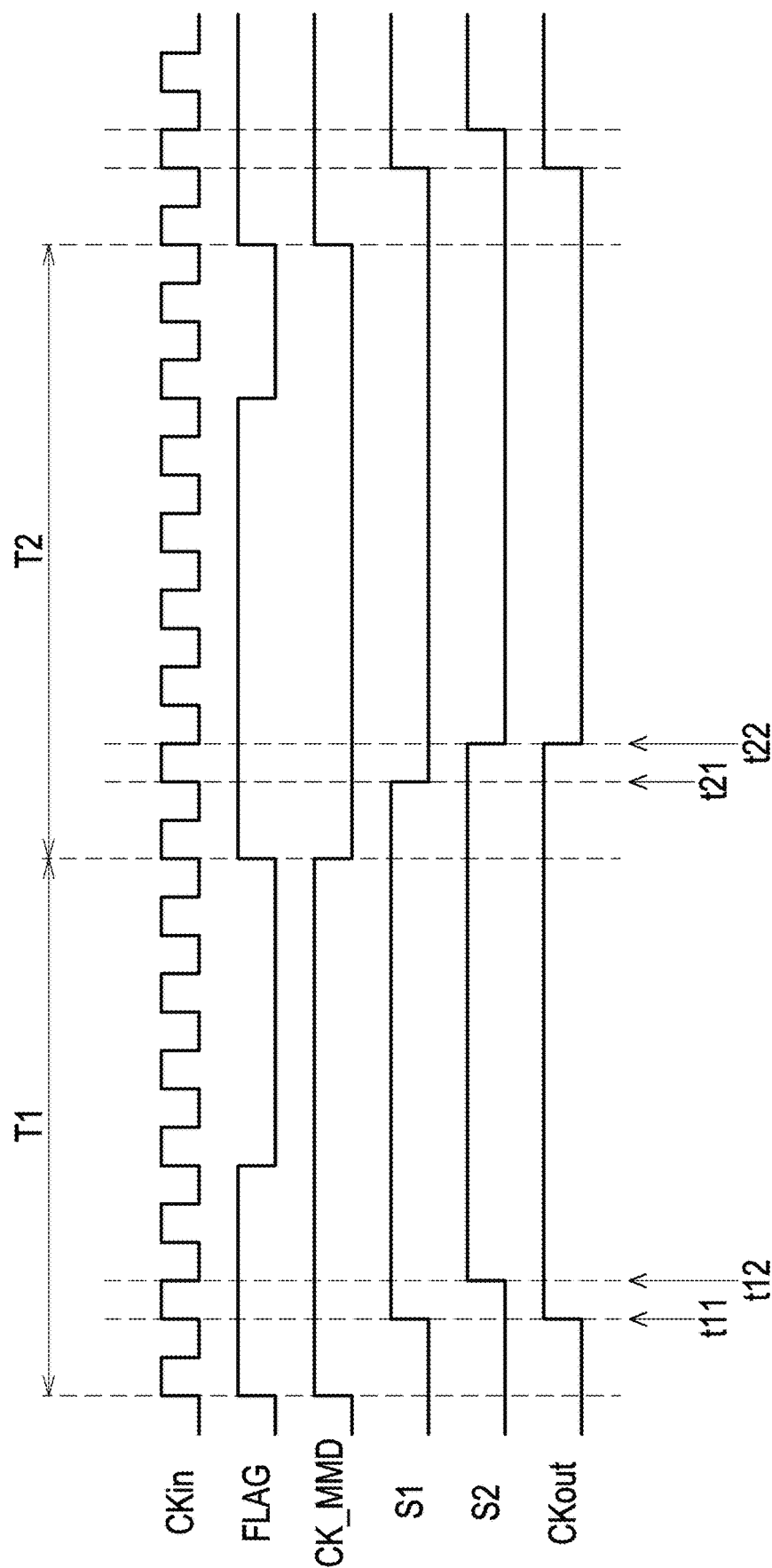
FIG. 3 shows a timing diagram of the multi-mode frequency division circuit of the embodiment in FIG. 2 of the disclosure.

For the description below, please refer to FIG. 2 and FIG. 3 simultaneously, in which FIG. 3 shows a timing diagram of the multi-mode frequency division circuit of the embodiment in FIG. 2 of the disclosure. In this embodiment, the frequency division factor N is, for example, equal to 15, the first sub-frequency division factor M1 is 7, the second sub-frequency division factor M2 is 8, and the least significant bit N<0> of the frequency division factor N is logic 1. T1 is 7 clock cycles of signal CKin, and T2 is 8 clock cycles of signal CKin. In the time interval T1, based on the frequency division clock signal CK_MMD being transitioned to logic 1, the first sub-frequency division factor M1 is output to the first frequency division device 221. The first frequency division device 221 divides the frequency of the clock signal CKin by 7 to generate the flag signal FLAG. Then, the second frequency division device 222 performs frequency division by two on the flag signal FLAG to generate the frequency division clock signal CK_MMD.

Next, at a time point t11, at the rising edge of the clock signal CKin, the flip flop DFF2 may sample the frequency division clock signal CK_MMD and generate the first signal S1 of logic 1. At this time, the second signal is logic 0. Since the least significant bit N<0> of the frequency division factor N is logic 1, the AND gate AN1 outputs the second signal of logic 0; the OR gate OR1 performs an OR operation on the first signal S1 and the second signal S2 to output the first signal S1 (logic 1) as the output clock signal CKout. Afterward, at a time point t12, at the falling edge of the clock signal CKin, the flip flop DFF3 may sample the first signal S1 and generate the second signal S2 of logic 1. Since the least significant bit N<0> of the frequency division factor N is logic 1, at this time, the AND gate AN1 outputs the second signal S2, in the time interval T1, the OR gate OR1 may perform an OR operation on the first signal S1 and the second signal S2 to generate the output clock signal CKout of logic 1, and increase a time for the output clock signal CKout keeping at logic 1 by half a cycle of the clock signal CKin.

In the time interval T2, based on the frequency division clock signal CK_MMD being transitioned to logic 0, the second sub-frequency division factor M2 is output to the first frequency division device 221. The first frequency division device 221 divides the frequency of the clock signal CKin by 8 to generate the flag signal FLAG. The second frequency division device 222 performs frequency division by two on the flag signal FLAG to generate the frequency division clock signal CK_MMD.

Next, at a time point t21, at the rising edge of the clock signal CKin, the flip flop DFF2 may sample the frequency division clock signal CK_MMD and generate the first signal S1 of logic 0. Afterward, at a time point t22, at the falling edge of the clock signal CKin, the flip flop DFF3 may sample the first signal S1 and generate the second signal S2 of logic 0. Also, the least significant bit N<0> of the frequency division factor N (N=15) is logic 1, and at this time, the AND gate AN1 outputs the second signal S2 of logic 0, and the OR gate OR1 performs an OR operation on the first signal S1 and the second signal S2 so that the output clock signal CKout is logic 0.

As may be seen from FIG. 3, the time when the output clock signal CKout is logic 0 is equal to the time when the signal is logic 1. Although the operation principle of the disclosure is described by taking the frequency division factor as an odd number as an example, the disclosure is not limited thereto, and the frequency division factor may be any positive integer.

According to the above description, it may be known that the positive and negative cycles of the output clock signal CKout may have the same time length. That is, the output clock signal CKout has a duty cycle of 50%.

Figure 4A:
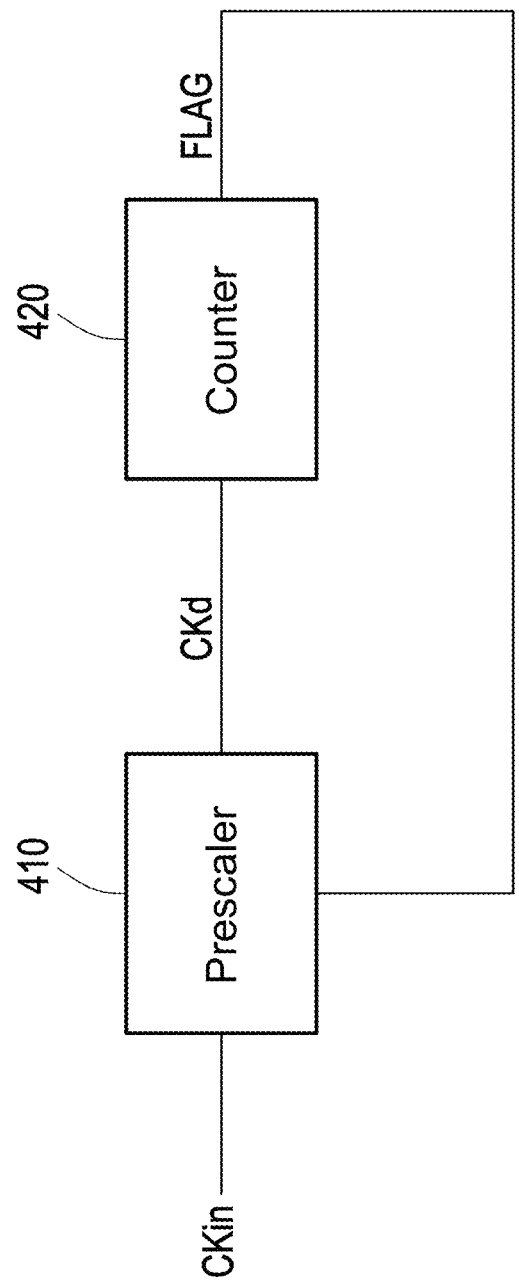
FIG. 4A shows a schematic diagram of a first frequency division device in the multi-mode frequency division circuit according to an embodiment of the disclosure.
Figure 4B:
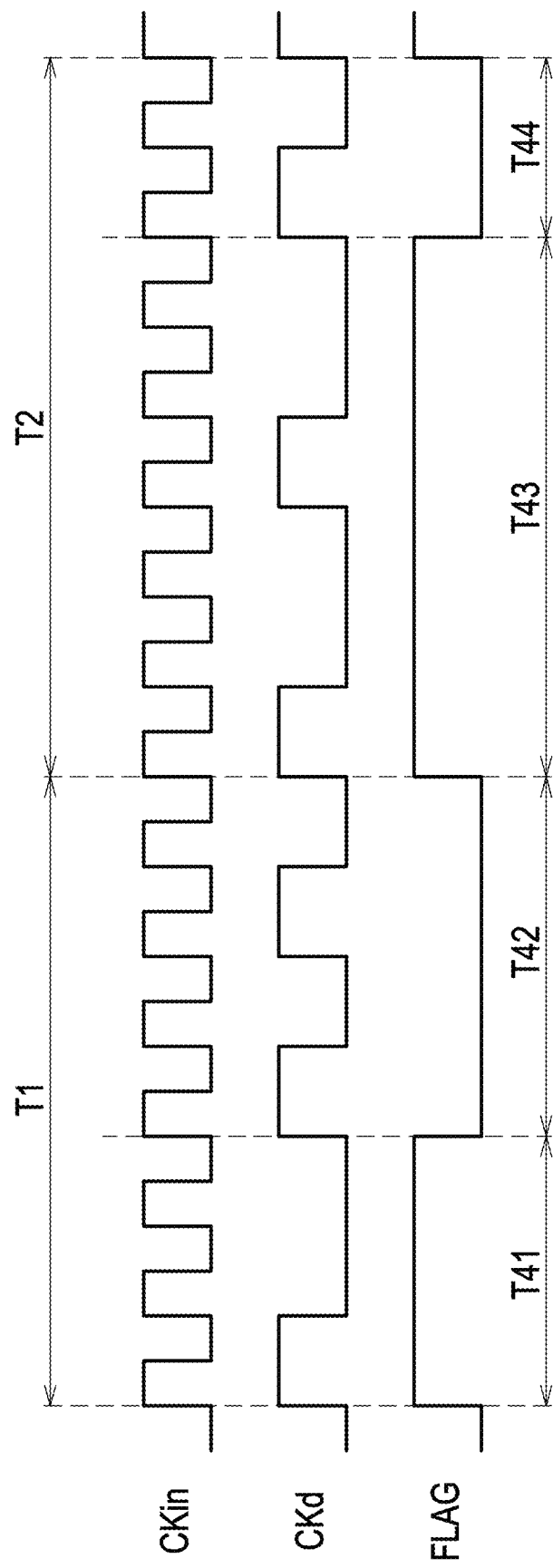
FIG. 4B shows a timing diagram of the first frequency division device of the embodiment in FIG. 4A.

For the description below, please refer to FIG. 4A and FIG. 4B. FIG. 4A shows a schematic diagram of a first frequency division device in the multi-mode frequency division circuit according to an embodiment of the disclosure, and FIG. 4B shows a timing diagram of the first frequency division device of the embodiment in FIG. 4A. A first frequency division device 400 may be a multi-mode frequency divider. The first frequency division device 400 includes a prescaler 410 and a counter 420. The prescaler 410 receives the clock signal CKin, and performs a prescaling operation on the clock signal CKin according to the flag signal FLAG fed back to generate a prescaling signal CKd. Specifically, when the flag signal FLAG is logic 0, the prescaler 410 divides the frequency of the clock signal CKin by k so that the flag signal FLAG being logic 0 is maintained for k cycles of CKin. On the other hand, when the flag signal FLAG is logic 1, the prescaler 410 divides the frequency of the clock signal CKin by k+1 so that the flag signal FLAG being logic 1 is maintained for k+1 cycles of CKin, in which k is a frequency division factor for prescaling, which may be any positive integer.

The counter 420 is coupled to the rear end of the prescaler 410 and used to count the prescaling signal CKd to generate the flag signal FLAG. The counter 420 counts the rising edges of the prescaling signal according to a first frequency division factor or a second frequency division factor to generate the flag signal FLAG.

For the description below, please refer to FIG. 4B. Similarly, it is assumed that the example is taken as follows. The frequency division factor N is equal to 15, the first sub-frequency division factor M1 is 7, the second sub-frequency division factor M2 is 8, and k is equal to 2. In the time interval T1, the first sub-frequency division factor M1 (=7) is output to the first frequency division device 400. In a time interval T41, based on the flag signal FLAG being logic 1, the prescaler 410 divides the frequency of the clock signal CKin by k+1 (=3) so that the flag signal FLAG being logic 1 is maintained for k+1 cycles of CKin. In a subsequent time interval T42, based on the flag signal FLAG being logic 0, the prescaler 410 divides the frequency of the clock signal CKin by k (=2) so that the flag signal FLAG being logic 0 is maintained for k cycles of CKin.

In the time interval T2, the second sub-frequency division factor M2 (=8) is output to the first frequency division device 400. In a time interval T43, based on the flag signal FLAG being logic 1, the prescaler 410 divides the frequency of the clock signal CKin by k+1 (=3) so that the flag signal FLAG being logic 1 is maintained for k+1 cycles of CKin. In a subsequent time interval T44, based on the flag signal FLAG being logic 0, the prescaler 410 divides the frequency of the clock signal CKin by k (=2) so that the flag signal FLAG being logic 0 is maintained for k cycles of CKin.

It is worth mentioning that the first frequency division device 400 in FIG. 4A is only an example for illustration and is not intended to limit the scope of implementation of the disclosure.

In other embodiments of the disclosure, the first frequency division device may be any conventional synchronous or asynchronous multi-mode frequency divider without any specific limitation.

The embodiment of the disclosure decomposes the frequency division factor N into two values M1 and M2 closest to each other (when N is an even number, M1=M2; when N is an odd number, M2=M1+1), and uses the multi-mode frequency divider MMD to sequentially perform frequency division on M1 and perform frequency division on M2 on the clock signal CKin input in turn, thereby the flag signal FLAG with the closest lengths of two adjacent cycles is obtained. Then, the rising edge of the flag signal FLAG is used as the trigger signal to perform frequency division by two to obtain the N-division frequency signal, namely the frequency division clock signal CK_MMD. The ratio of high level to low level of the frequency division clock signal CK_MMD is M1/M2. Then, the frequency division clock signal CK_MMD is sequentially sampled according to the rising edge and the falling edge of the clock signal CKin to obtain the first signal S1 and the second signal S2, and an OR operation is performed on the first signal S1 and the second signal S2 to generate the output clock signal CKout, as a result, an output clock signal having a duty cycle of 50% can be output for any frequency division factor N.

The disclosure decomposes the frequency division factor N based on the existing multi-mode frequency divider MMD, and corrects the duty cycle of the output clock signal in combination with a simple logic circuit, as a result, an output clock signal having a duty cycle of 50% can be output for any frequency division factor N. The implementation method is simple, at the same time, the frequency division factor decomposed is halved, which reduces the number of bits in the counter by 1, thereby the timing margin is optimized and the design difficulty is reduced.

Finally, it should be noted that the above embodiments are only used to illustrate the technical solutions of the disclosure, and the embodiments are not to limit the disclosure. Although the disclosure has been described in detail with reference to the embodiments, persons skilled in the art should understand that the technical solutions described in the embodiments may still be modified, or some or all of the technical features thereof may be replaced by equivalents. However, the modifications or substitutions do not make the essence of the corresponding technical solutions deviate from the scope of the technical solutions of the embodiments of the disclosure.

What is claimed is:

1. A multi-mode frequency division circuit, comprising:
a frequency division factor processor, receiving a frequency division factor, decomposing the frequency division factor to obtain a first sub-frequency division factor and a second sub-frequency division factor, and selectively outputting the first sub-frequency division factor or the second sub-frequency division factor according to a frequency division clock signal;
a frequency divider, coupled to the frequency division factor processor, receiving a clock signal, performing frequency division on the clock signal based on the first sub-frequency division factor or the second sub-frequency division factor to generate the frequency division clock signal; and
a logic operator, sequentially sampling the frequency division clock signal according to a rising edge and a falling edge of the clock signal to generate a first signal and a second signal, and generating an output clock signal according to the first signal, the second signal, and an indication signal.

2. The multi-mode frequency division circuit according to claim 1, wherein a duty cycle of the output clock signal is 50%.

3. The multi-mode frequency division circuit according to claim 1, wherein the frequency division factor processor removes a least significant bit of the frequency division factor to obtain the first sub-frequency division factor, and the first sub-frequency division factor is added to the least significant bit of the frequency division factor to obtain the second sub-frequency division factor.

4. The multi-mode frequency division circuit according to claim 3, wherein the frequency division factor processor comprises:
   a first buffer, configured to store the first sub-frequency division factor;
   a second buffer, configured to store the second sub-frequency division factor; and
   a multiplexer, coupled to the first buffer and the second buffer, and selectively outputting the first sub-frequency division factor or the second sub-frequency division factor according to the frequency division clock signal.

5. The multi-mode frequency division circuit according to claim 1, wherein the frequency divider comprises:
   a first frequency division device, performing frequency division on the clock signal according to the first sub-frequency division factor or the second sub-frequency division factor to generate a flag signal; and
   a second frequency division device, coupled to the first frequency division device, and performing frequency division by two on the flag signal to generate the frequency division clock signal.

6. The multi-mode frequency division circuit according to claim 5, wherein the first frequency division device comprises:
   a prescaler, performing prescaling on the clock signal according to the flag signal to generate a prescaling signal; and
   a counter, counting rising edges of the prescaling signal according to the first sub-frequency division factor or the second sub-frequency division factor to generate the flag signal.

7. The multi-mode frequency division circuit according to claim 6, wherein the prescaler divides a frequency of the clock signal by k in response to the flag signal being logic 0 and divides the frequency of the clock signal by k+1 in response to the flag signal being logic 1, and k is a frequency division factor for prescaling and a positive integer.

8. The multi-mode frequency division circuit according to claim 5, wherein the second frequency division device is a D-type flip flop.

9. The multi-mode frequency division circuit according to claim 8, wherein the indication signal is a least significant bit of the frequency division factor.

10. The multi-mode frequency division circuit according to claim 1, wherein the logic operator comprises:
    a first flip flop, sampling the frequency division clock signal according to the rising edge of the clock signal to generate the first signal;
    a second flip flop, sampling the first signal according to the falling edge of the clock signal to generate the second signal;
    an AND gate, receiving the second signal and the indication signal to generate a third signal; and
    an OR gate, receiving the first signal and the third signal to generate the output clock signal.

11. The multi-mode frequency division circuit according to claim 1, wherein in response to the frequency division factor being an even number, the first sub-frequency division factor and the second sub-frequency division factor are equal, and in response to the frequency division factor being an odd number, a difference between the second sub-frequency division factor and the first sub-frequency division factor is 1.

* * * * *